(12) United States Patent
Zhu et al.

(10) Patent No.: US 10,481,748 B2
(45) Date of Patent: Nov. 19, 2019

(54) DISPLAY PANEL AND DISPLAY APPARATUS

(71) Applicant: Xiamen Tianma Micro-Electronics Co., Ltd., Xiamen (CN)

(72) Inventors: Zaiwen Zhu, Xiamen (CN); Jieliang Li, Xiamen (CN); Yong Yuan, Shanghai (CN); Feng Lu, Shanghai (CN); Qijun Yao, Shanghai (CN); Hongming Chen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/813,474

(22) Filed: Nov. 15, 2017

(65) Prior Publication Data
US 2018/0074622 A1 Mar. 15, 2018

(30) Foreign Application Priority Data

Jun. 30, 2017 (CN) .......................... 2017 1 0523323

(51) Int. Cl.
| | |
|---|---|
| *G06F 3/045* | (2006.01) |
| *G01L 1/22* | (2006.01) |
| *G02F 1/1333* | (2006.01) |
| *G02F 1/1339* | (2006.01) |
| *G02F 1/1362* | (2006.01) |
| *H01L 27/12* | (2006.01) |
| *G06F 3/041* | (2006.01) |
| *G02F 1/1368* | (2006.01) |

(52) U.S. Cl.
CPC ............ *G06F 3/045* (2013.01); *G01L 1/2262* (2013.01); *G01L 1/2293* (2013.01); *G02F 1/1339* (2013.01); *G02F 1/13338* (2013.01); *G02F 1/136209* (2013.01); *G02F 1/136286* (2013.01); *G06F 3/0414* (2013.01); *H01L 27/124* (2013.01); *H01L 27/1222* (2013.01); *G02F 1/1368* (2013.01); *G02F 2001/13685* (2013.01); *G02F 2001/133388* (2013.01); *G02F 2202/104* (2013.01)

(58) Field of Classification Search
None
See application file for complete search history.

(56) References Cited

U.S. PATENT DOCUMENTS

2012/0118068 A1* 5/2012 Yamada ................ G01L 9/0042
73/754
2017/0185211 A1* 6/2017 Lu ......................... G06F 3/0412

FOREIGN PATENT DOCUMENTS

| CN | 102472678 A | 5/2012 | |
|---|---|---|---|
| CN | 201510995693 | * 12/2015 | ............. G06F 3/041 |
| CN | 105511679 A | 4/2016 | |

* cited by examiner

*Primary Examiner* — Ifedayo B Iluyomade
(74) *Attorney, Agent, or Firm* — Alston & Bird LLP

(57) ABSTRACT

A display panel and a display apparatus are provided. The display panel includes a display area and a non-display area surrounding the display area. The display panel includes at least one semiconductor pressure sensor disposed in the non-display area. Each semiconductor pressure sensor has a planar structure and is provided with a hollow-out zone. In various embodiments of the present disclosure, the pressure detection accuracy of the pressure sensors is improved and the user experience is enhanced.

18 Claims, 15 Drawing Sheets

DISPLAY PANEL AND DISPLAY APPARATUS

CROSS-REFERENCE TO RELATED APPLICATIONS

This application claims priority to a Chinese patent application No. CN201710523323.2 filed on Jun. 30, 2017, the disclosure of which is incorporated herein by reference in its entirety.

TECHNICAL FIELD

The present disclosure relates to the field of display technology and in particular relates to a display panel and a display apparatus.

BACKGROUND

Recently, a variety of display panels and display apparatuses have been developed. FIG. 15 is a schematic block diagram of a display apparatus according to the related arts. Referring to FIG. 15, the display apparatus includes a display panel having a plurality of pixel cells forming a matrix. The pixel cells are located at pixel areas defined by crossings of scan electrode lines SL1 to SLn and data electrode lines DL1 to DLm. A scanning line drive circuit is provided for driving the scan electrode lines SL1 to SLn. A data line drive circuit is provided for driving the data electrode lines DL1 to DLm. A timing controller controls the timing for driving the scanning line drive circuit and the data line drive circuit. The timing controller generates a data control signal for controlling the data line drive circuit and a scan control signal for controlling scanning line drive circuit. The scanning line drive circuit generates a scanning pulse in response to the scanning control signal from the timing controller, and applies the scanning pulse to the scan electrode lines SL1 to SLn to sequentially drive the scan electrode lines SL1 to SLn. The data line drive circuit supplies a data voltage to the data electrode lines DL1 to DLm in response to the data control signal from the timing controller.

At present, a display panel with a touch function is widely used as an information input tool in various display products, such as a mobile phone, a tablet computer and self-service kiosks in the public place. Accordingly, such electronic device may be manipulated by a user merely through touching icons on the touch screen panel with his/her finger without using any other input devices (e.g., a keyboard, a mouse and the like), so that the human-computer interaction is easier.

In order to better meet requirements from users, a pressure sensor is generally provided in the touch panel to detect a pressure exerted on the touch panel when the user touches the touch panel. The pressure sensor generally includes pressure sensitive elements and a signal processing unit. The pressure sensor is configured to detect a pressure signal and convert the pressure signal into an electrical signal according to a preset rule. The pressure sensor is capable of collecting not only information regarding the touch location but also the magnitude of the pressure exerted on the touch panel, so that the applied range of touch display technology is enriched. However, existing pressure sensors have low pressure detection accuracy, which affects the user experience.

SUMMARY

To increase the pressure detection accuracy of the pressure sensor and improve the user experience, the present disclosure provides a display panel and a display apparatus.

In a first aspect, embodiments of the disclosure provide a display panel, which includes a display area and a non-display area surrounding the display area. The display panel further includes at least one semiconductor pressure sensor disposed in the non-display area. The semiconductor pressure sensor has a planar structure and is provided with a hollow-out zone.

In a second aspect, embodiments of the disclosure further provide a display apparatus. The display apparatus includes a display panel according to any of the embodiments of the present disclosure.

In the embodiments of the disclosure, the semiconductor pressure sensor is provided with the hollow-out zone, so that the semiconductor pressure sensor is equivalent to four equivalent resistors, thereby improving the sensitivity of the Wheatstone bridge on the pressure and increasing the pressure detection accuracy of the semiconductor pressure sensor. In addition, by providing the hollow-out zone, the heat dissipation effect of the semiconductor pressure sensor is better and the influence of temperature on the pressure detection is reduced.

DETAILED DESCRIPTION

Figure 1:
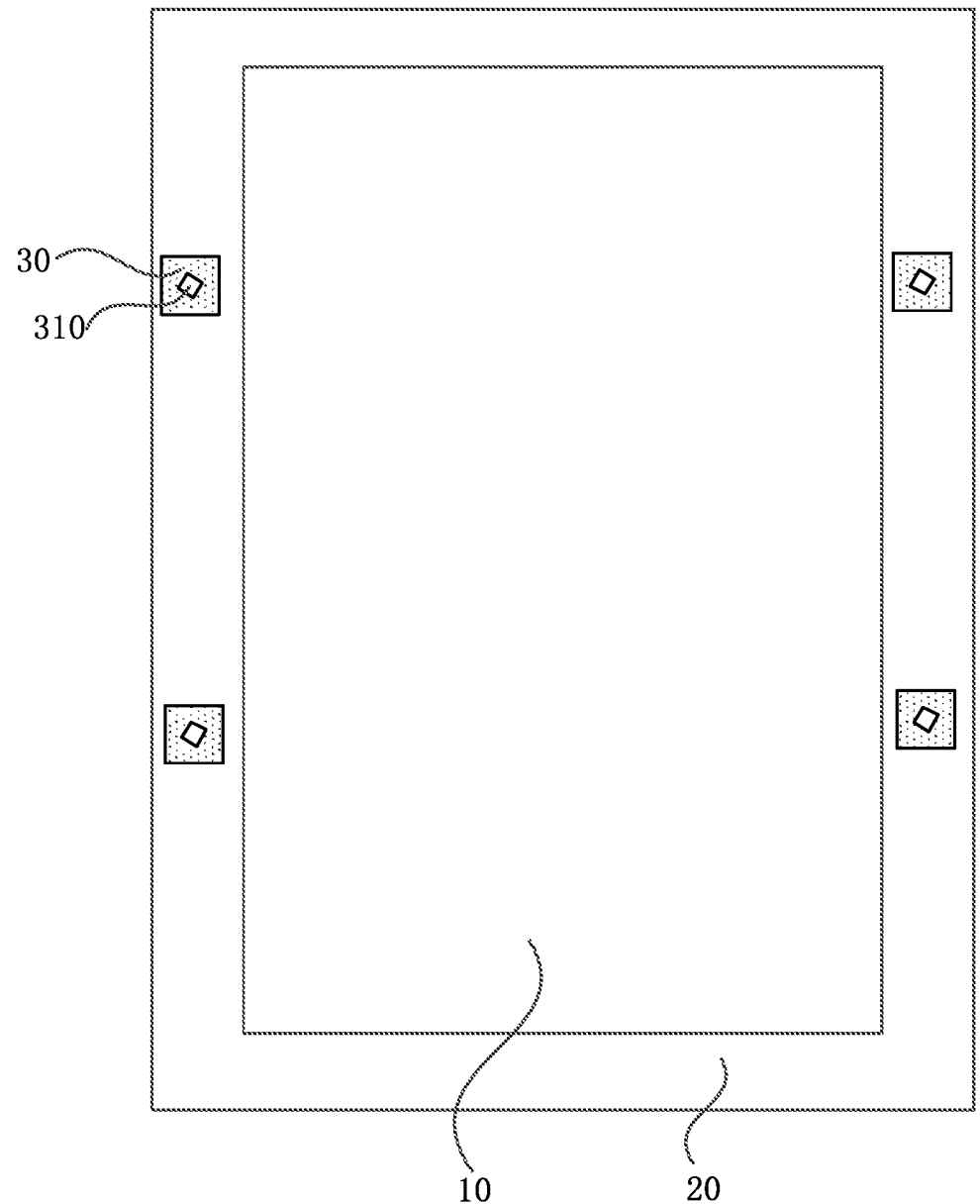
FIG. 1 is a schematic diagram illustrating a display panel provided by embodiments of the present disclosure.

The present disclosure is further described below in combination with the drawings and embodiments. It should be understood that, the specific embodiments described herein are merely used to explain the present disclosure rather than limiting the present disclosure. In addition, it should be stated that in order to facilitate the description, merely a part of structures related to the present disclosure rather than the whole structure are illustrated in the drawings.

The embodiments of the present disclosure provide a display panel as shown in FIG. 1. Referring to FIG. 1, the display panel includes a display area 10 and a non-display area 20 surrounding the display area.

The display panel includes at least one semiconductor pressure sensor 30 disposed in the non-display area 20. Each semiconductor pressure sensor 30 has a planar structure, and is provided with a hollow-out zone 310.

Figure 2:
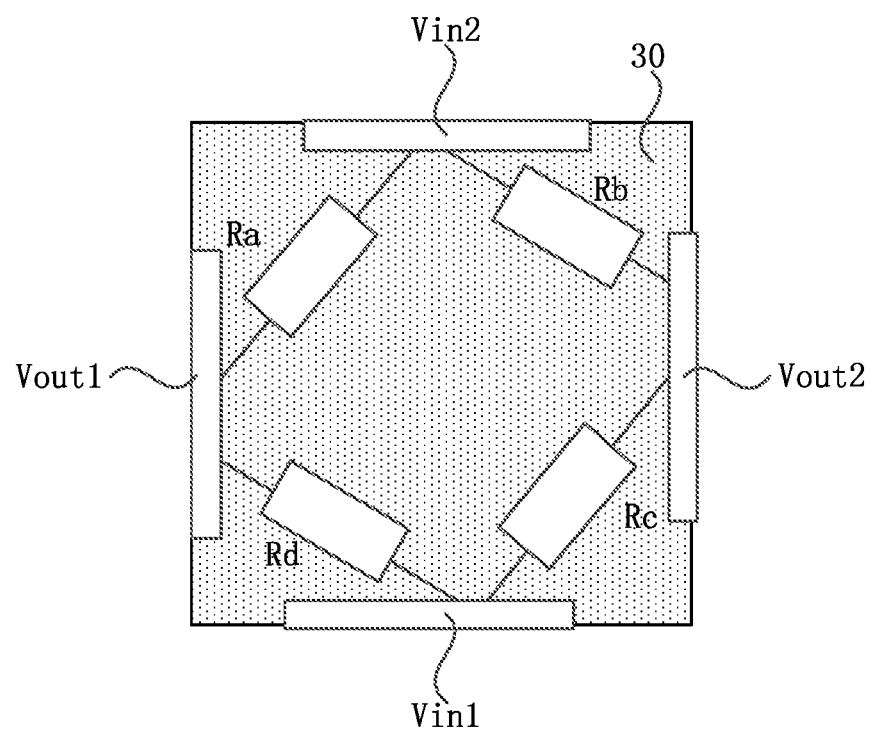
FIG. 2 is a schematic diagram illustrating a semiconductor pressure sensor provided by an embodiment of the present disclosure.

FIG. 2 is an equivalent schematic diagram illustrating a semiconductor pressure sensor provided by embodiments of the present disclosure. Referring to FIG. 2, the semiconductor pressure sensor 30 has four terminals: a first power signal input terminal Vin1, a second power signal input terminal Vin2, a first sensing signal measurement terminal Vout1 and a second sensing signal measurement terminal Vout2. The semiconductor pressure sensor 30 is equivalent to a Wheatstone bridge including four equivalent resistors: Ra, Rb, Rc, and Rd. A region between the second power signal input terminal Vin2 and the first sensing signal measurement terminal Vout1 corresponds to the equivalent resistor Ra. A region between the second power signal input terminal Vin2 and the second sensing signal measurement terminal Vout2 corresponds to the equivalent resistor Rb. A region between the first power signal input terminal Vin1 and the first sensing signal measurement terminal Vout1 corresponds to the equivalent resistor Rd. A region between the first power signal input terminal Vin1 and the second sensing signal measurement terminal Vout2 corresponds to the equivalent resistor Rc. When a bias voltage signal is applied between the first power signal input terminal Vin1 and the second power signal input terminal Vin2, a current flows through each branch of the Wheatstone bridge. At this moment, a deformation occurs in the display panel if the display panel is pressed. Accordingly, the semiconductor pressure sensor 30 deforms, i.e., the resistance of at least one of the four equivalent resistors Ra, Rb, Rc and Rd in the semiconductor pressure sensor 30 changes. As a result, compared with a difference between a pressure sensing measurement signal output from the first sensing signal measurement terminal Vout1 and a pressure sensing measurement signal output from the second sensing signal measurement terminal Vout2 of the semiconductor pressure sensor 30 when the display panel is not pressed, the difference between the pressure sensing measurement signal output from the first sensing signal measurement terminal Vout1 and the pressure sensing measurement signal output from the second sensing signal measurement terminal Vout2 when the display panel is pressed is different. Based on the difference, the value of the pressure can be determined.

Specifically, referring to FIG. 2, for a semiconductor pressure sensor 30 without a hollow-out zone, the central area of the semiconductor pressure sensor 30, namely the region among the four equivalent resistors, is connected with the four equivalent resistors. In a practical pressure detection, due to the interaction between the four equivalent resistors, the performance of the Wheatstone bridge is affected, thereby reducing the pressure detection accuracy of the semiconductor pressure sensor 30. On the contrary, by providing a hollow-out zone in the semiconductor pressure sensor 30, the equivalent resistors Ra, Rb, Rc and Rd are independent from each other, thereby increasing the sensitivity of the Wheatstone bridge on pressure and further improving the pressure detection accuracy. Moreover, the heat dissipation of the semiconductor pressure sensor 30 is improved by providing the hollow-out zone, and thus the influence of temperature on pressure detection is reduced.

Figure 3:
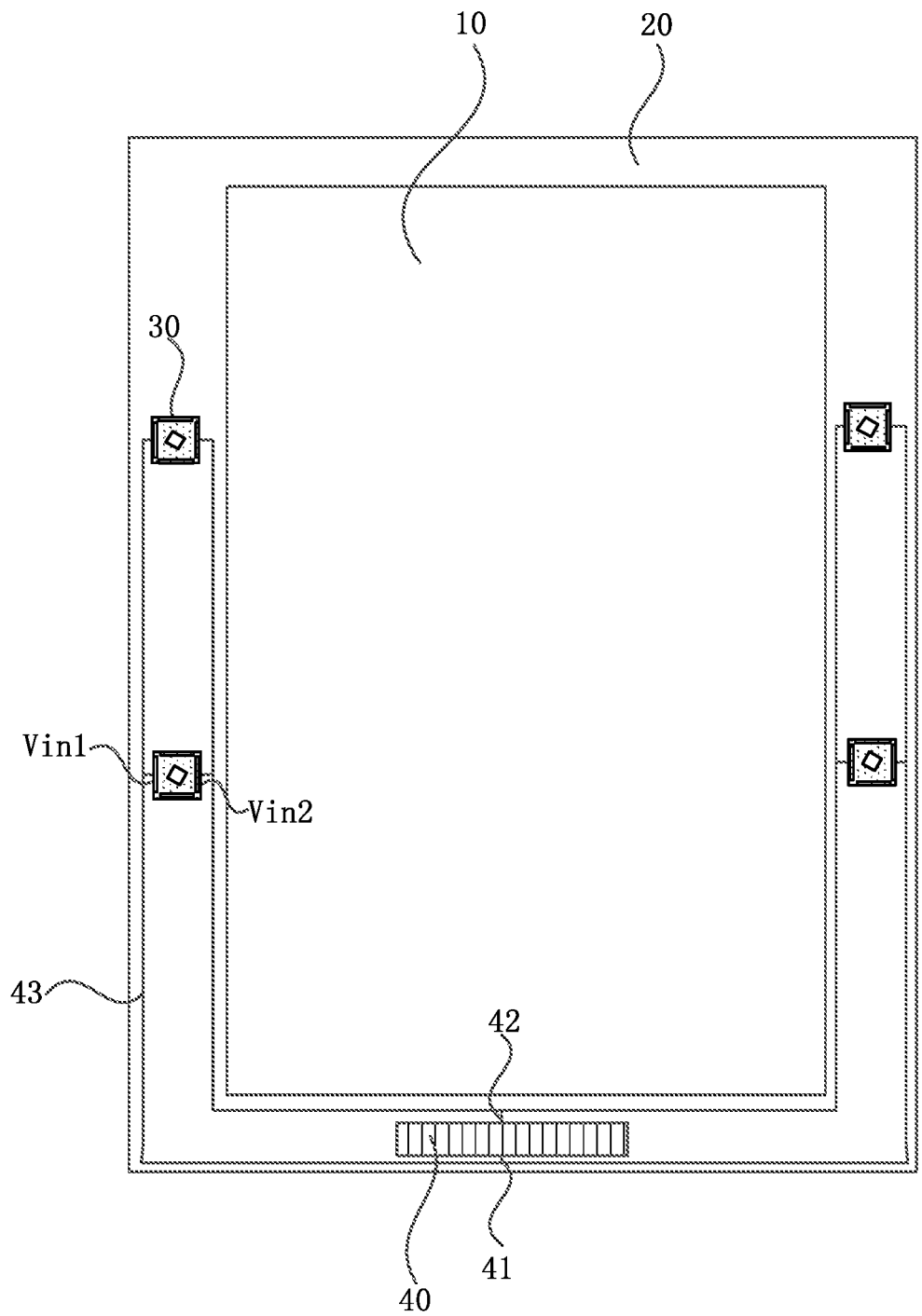
FIG. 3 is a schematic diagram illustrating another display panel provided by an embodiment of the present disclosure.

FIG. 3 is a schematic diagram illustrating another display panel provided by an embodiment of the present disclosure. Optionally, referring to FIG. 3, the display panel further includes a drive circuit 40 which is configured to provide a bias voltage to each semiconductor pressure sensor 30. The first power signal input terminal Vin1 of each semiconductor pressure sensor 30 located at the same side of the display area 10 is connected with a first signal output terminal 41 of the drive circuit 40, and the second power signal input terminal Vin2 of each semiconductor pressure sensor located at the same side of the display area 10 is connected with a second signal output terminal 42 of the drive circuit 40.

Specifically, the drive circuit 40 is electrically connected with each semiconductor pressure sensor 30 through a power signal line 43. The power signal line 43 has a large resistance due to the length thereof, causing the voltage division on the power signal line 43 to be large. As a result, the bias voltage transmitted to the pressure sensor 30 is affected, thereby prejudicing the pressure detection accuracy of the semiconductor pressure sensor 30. By providing the hollow-out zone, the resistances of the equivalent resistors Ra, Rb, Rc and Rd are increased so that the voltage division of the semiconductor pressure sensor 30 is increased, thereby ensuring the semiconductor pressure sensor 30 to have a large bias voltage and have an increased pressure detection accuracy.

Moreover, the first power signal input terminal Vin1 of each semiconductor pressure sensor 30 located at the same side of the display area 10 may be connected together, and then connected to the first signal output terminal 41 of the drive circuit 40 through a single power signal line 43; the second power signal input terminal Vin2 of each semiconductor pressure sensor 30 located at the same side of display area 10 may be connected together, and then connected to the second signal output terminal 42 of the drive circuit 40 through a single power signal line 43. In this way, the number of the power signal lines 43 is reduced and the number of wirings in the non-display area 20 is reduced, which facilitates to narrow the border of the display panel. In addition, the mutual interference between the power signal lines 43 and other lines placed in the non-display area 20 can be prevented due to the reduced number of wirings in the non-display area 20.

Figure 4:
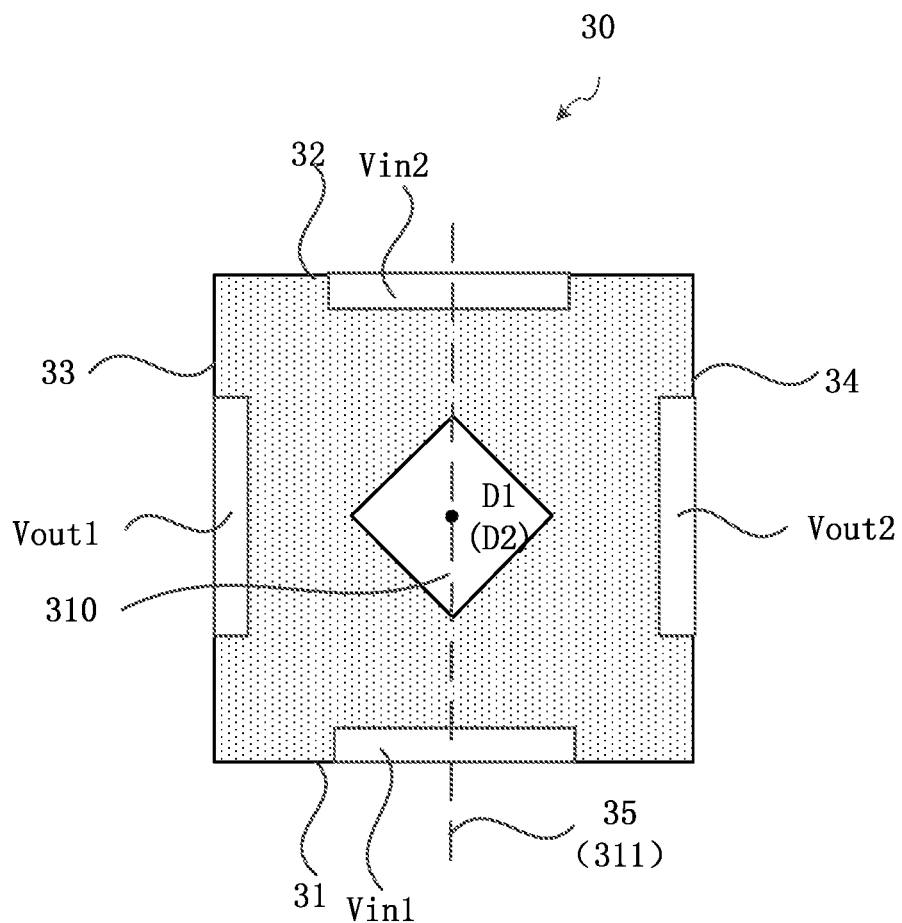
FIG. 4 is a schematic diagram illustrating a semiconductor pressure sensor provided by an embodiment of the present disclosure.

FIG. 4 is a schematic diagram illustrating a semiconductor pressure sensor provided by embodiments of the present disclosure. Optionally, referring to FIG. 4, a geometric center D1 of the hollow-out zone 310 coincides with a geometric center D2 of an outline of the semiconductor pressure sensor 30.

Through such arrangement, a shape distribution of the semiconductor pressure sensor 30 is uniform, and thus a resistance distribution of the four equivalent resistors is uniform, thereby facilitating the semiconductor pressure sensor 30 to detect the deformations of the display panel in different directions.

Optionally, referring to FIG. 4, the outline of the semiconductor pressure sensor 30 is a polygon having at least four sides, including a first side 31, a second side 32, a third side 33 and a fourth side 34. The first side 31 and the second side 32 are separated by at least one side of the polygon, and the third side 33 and the fourth side 34 are separated by at least one side of the polygon.

The semiconductor pressure sensor 30 includes the first power signal input terminal Vin1 located at the first side 31 and the second power signal input terminal Vin2 located at the second side. The first power signal input terminal Vin1 and the second power signal input terminal Vin2 are configured to provide the bias voltage signal to the semiconductor pressure sensor 30.

The semiconductor pressure sensor 30 further includes the first sensing signal measurement terminal Vout1 located at the third side 33 and the second sensing signal measurement terminal Vout2 located at the fourth side 34. The first sensing signal measurement terminal Vout1 and the second sensing signal measurement terminal Vout2 are configured to output a pressure detection signal from the semiconductor pressure sensor 30.

Specifically, the outline of the semiconductor pressure sensor 30 may be a polygon, such as a quadrangle, a pentagon, a hexagon and the like. Exemplarily, the semiconductor pressure sensor 30 is illustrated as a quadrangle in FIG. 4, but it is not a limitation to the present disclosure.

Figure 5:
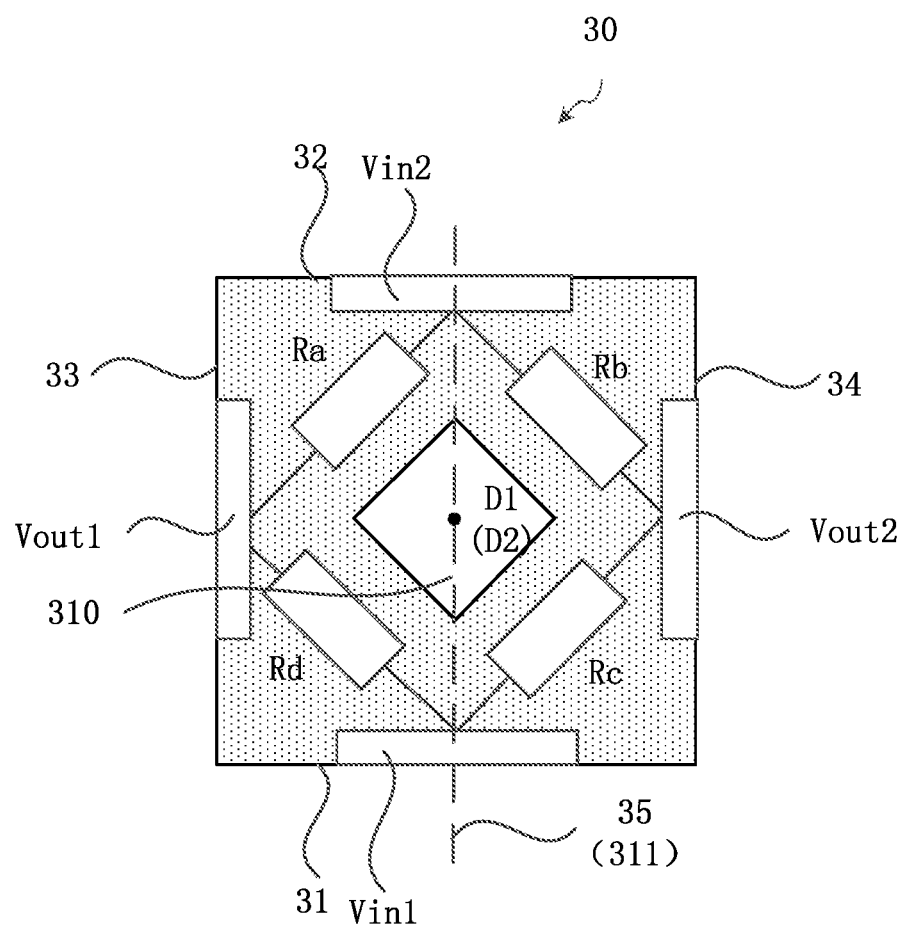
FIG. 5 is an equivalent circuit diagram of the semiconductor pressure sensor in FIG. 4.

FIG. 5 is a equivalent circuit diagram of the semiconductor pressure sensor in FIG. 4. Optionally, referring to FIG. 4 and FIG. 5, the semiconductor pressure sensor 30 is axisymmetric.

Specifically, by setting the semiconductor pressure sensor 30 to be axisymmetric, the semiconductor pressure sensor 30 has the same shape at two sides of a symmetry axis 35, so that the equivalent resistances at two sides of the symmetry axis 35 are equal to each other. Exemplarily, referring to FIG. 4 and FIG. 5, the symmetry axis 35 is perpendicular to the second side 32 and the first side 31 of the semiconductor pressure sensor 30, and the third side 33 and the fourth side 34 are symmetric about the symmetry axis 35. Then, for the four equivalent resistors, Ra is equal to Rb, and Rc is equal to Rd. When no pressure is applied on the display panel, Ra/Rd=Rb/Rc is met, and the Wheatstone bridge equivalent to the semiconductor pressure sensor 30 is balanced. Therefore, the difference between the pressure detection signal output from the first sensing signal measurement terminal Vout1 and the pressure detection signal output from the second sensing signal measurement terminal Vout2 is zero. When a pressure is applied on the display panel, the difference between the pressure detection signal output from the first sensing signal measurement terminal Vout1 and the pressure detection signal output from the second sensing signal measurement terminal Vout2 is changed to be nonzero from zero. Therefore, the sensitivity of pressure detection is improved, and the computational complexity of pressure is eased.

In addition, the symmetry axis of the semiconductor pressure sensor may be perpendicular to the second side and the first side, and the third side and the fourth side are symmetric about the symmetry axis, as shown in FIG. 4 and FIG. 5. Alternatively, the symmetry axis of the semiconductor pressure sensor may also be perpendicular to the third side and the fourth side, and the first side and the second side are symmetric about the symmetry axis. Through such arrangement, when no pressure is applied, the Wheatstone bridge equivalent to the semiconductor pressure sensor is ensured to be balanced, and the difference between the pressure detection signal output from the first sensing signal measurement terminal and the pressure detection signal output from the second sensing signal measurement terminal is zero.

Figure 6:
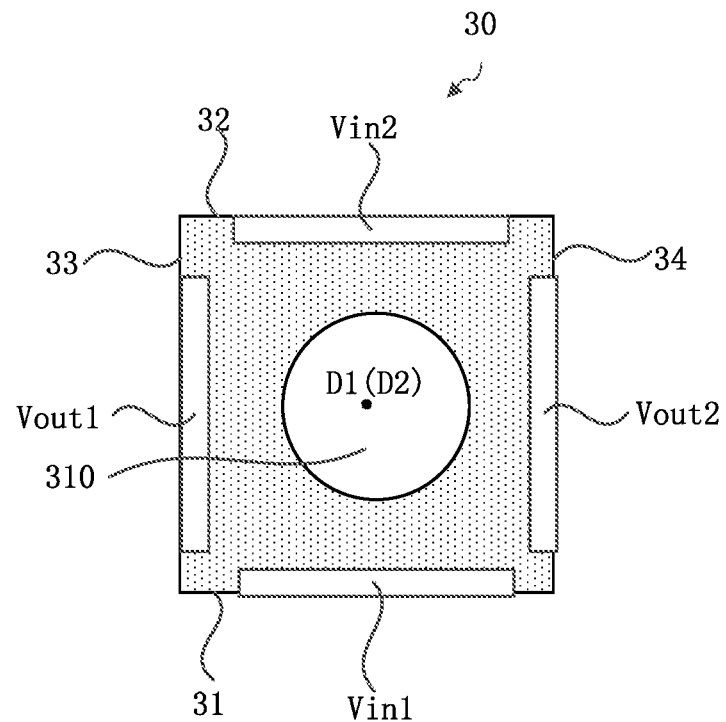
FIG. 6 is a schematic diagram illustrating another semiconductor pressure sensor provided by an embodiment of the present disclosure.
Figure 7:
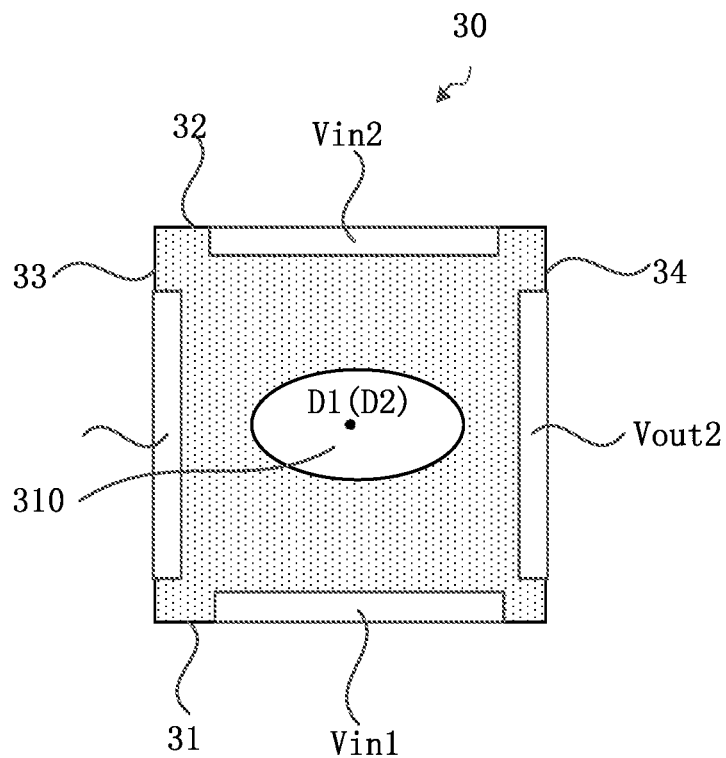
FIG. 7 is a schematic diagram illustrating another semiconductor pressure sensor provided by an embodiment of the present disclosure.

FIG. 6 is a schematic diagram illustrating another semiconductor pressure sensor provided by an embodiment of the present disclosure. FIG. 7 is a schematic diagram illustrating another semiconductor pressure sensor provided by an embodiment of the present disclosure. Optionally, referring to FIG. 4 to FIG. 7, the shape of the hollow-out zone may be a polygon, a circle or an ellipse.

Specifically, the shape of the hollow-out zone 310 may be set based on the outline of the semiconductor pressure sensor 30 and the initial resistances of the four equivalent resistors, which is not limited herein.

Optionally, referring to FIG. 4 and FIG. 5, the outline of the semiconductor pressure sensor 30 may be a square, and the shape of the hollow-out zone 310 may also be a square. A diagonal line 311 of the hollow-out zone 310 is perpendicular to one side of the outline of the semiconductor pressure sensor 30.

Specifically, the shape of the hollow-out zone 310 affects the resistance distribution of the four equivalent resistors of the semiconductor pressure sensor 30, thereby affecting an initial output value (i.e., the difference between the pressure detection signal output from the first sensing signal measurement terminal Vout1 and the pressure detection signal output from the second sensing signal measurement terminal Vout2 when no pressure is applied) of the Wheatstone bridge equivalent to the semiconductor pressure sensor 30. In addition, in order to detect the magnitude of the touch pressure, Ra and Rb in the Wheatstone bridge are generally required to sense different deformations, and Rc and Rd in the Wheatstone bridge are generally required to sense different deformations. For example, Ra and Rc are used to sense compressive deformation, Rb and Rd are used to sense extensional deformation. The shape of the hollow-out zone 310 also affects the shape distribution of the four equivalent resistors, thereby affecting the deformation sensed by the four equivalent resistors. As a result, when the pressure is applied, a variation in resistance of the four equivalent resistors and the pressure detection accuracy of the semiconductor pressure sensor 30 are affected.

Specifically, by setting the hollow-out zone 310 and the outline of the semiconductor pressure sensor 30 as a square and making the diagonal line 311 of the hollow-out zone 310 be perpendicular to one side of the outline of the semiconductor pressure sensor 30, the semiconductor pressure sensor 30 is centrosymmetric about the geometric center D1, D2. Therefore, the shapes of areas corresponding to the four equivalent resistors are the same, so that the resistances of the four equivalent resistors of the semiconductor pressure sensor 30 are equal to each other. As a result, the initial output value of the Wheatstone bridge is zero, thereby improving the sensitivity of pressure detection and easing the computational complexity of the pressure. In addition, among the four equivalent resistors, the shape distributions of Ra and Rc are the same, the shape distributions of Rb and Rd are the same, and the shape of Ra, Rc is rotated 90 degree relative to the shape of Rb, Rd. Therefore, Ra and Rc are used to measure the deformation in the same direction, and Rb and Rd are used to measure the deformation in the same direction. Since the direction measured by Ra and Rc is different from that measured by Rb and Rd, the semiconductor pressure sensor 30 is ensured to measure the pressure applied on the display panel accurately.

Figure 8:
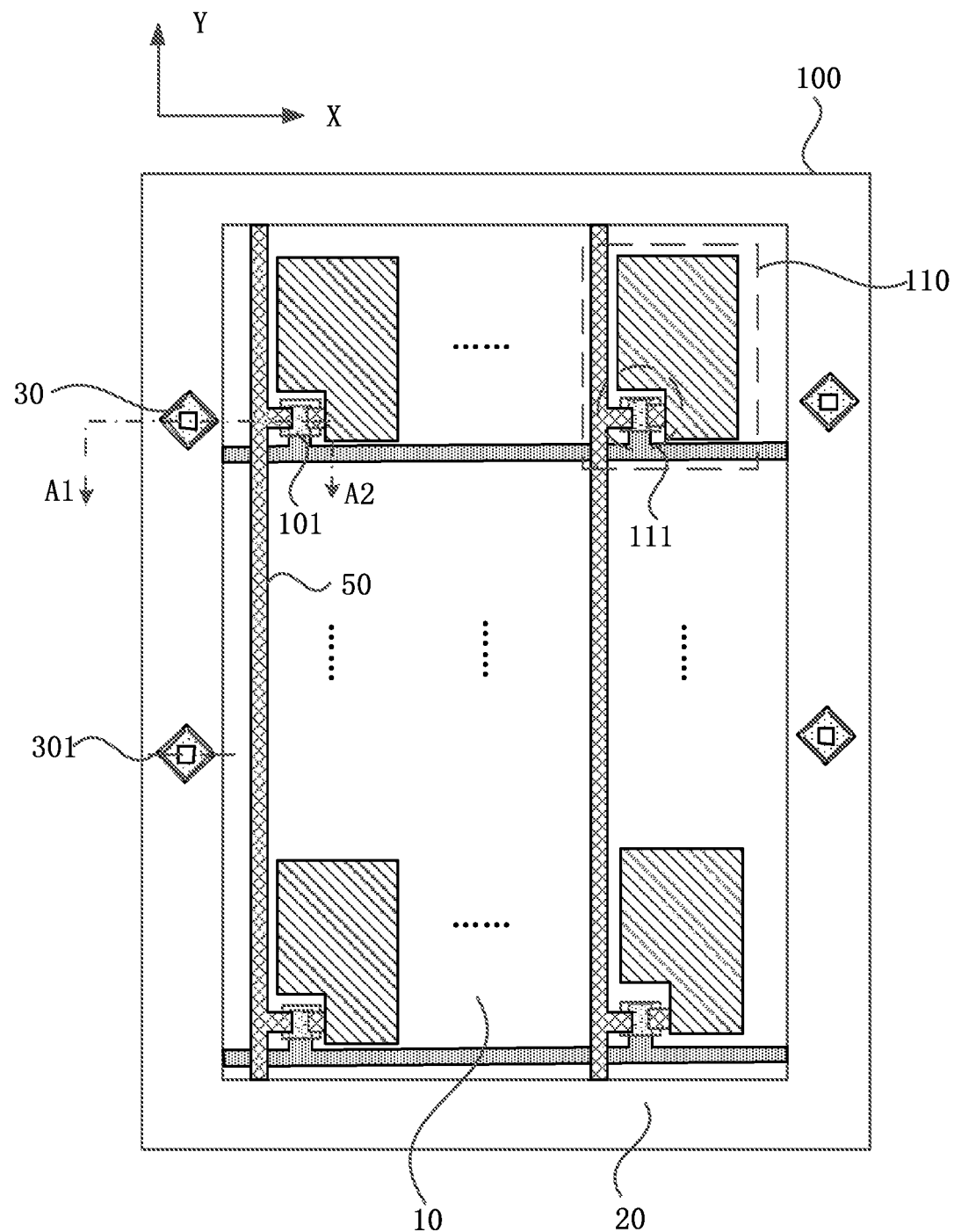
FIG. 8 is a schematic diagram illustrating another display panel provided by an embodiment of the present disclosure.

FIG. 8 is a schematic diagram illustrating another display panel provided by an embodiment of the present disclosure. Optionally, referring to FIG. 8, the display panel further includes a plurality of data lines 50. One diagonal line 301 of the outline of each semiconductor pressure sensor 30 is perpendicular to the data lines 50.

Specifically, an angle between the diagonal line of each semiconductor pressure sensor 30 and the data line 50 will affect the sensitivity in sensing the touch pressure of the semiconductor pressure sensor 30. The inventor found the following conclusions through experiments and simulations: when the display panel is pressed, different deformations occur at the position where the display panel is pressed in different directions, and there exists a large deformation difference between the deformation caused in x direction and the deformation caused in y direction, where the x direction and the y direction are directions along the long side and short side of the display panel respectively. By setting the diagonal line 301 of the semiconductor pressure sensor 30 to be perpendicular to the data lines 50, the equivalent resistors Ra, Rc and the equivalent resistors Rb, Rd of the semiconductor pressure sensor 30 are used to measure the deformation in the x direction and the deformation in the y direction respectively. When a same pressure is applied, there exists a large difference between a resistance variance of the equivalent resistors Ra, Rc and a resistance variance of the equivalent resistors Rb, Rd. Accordingly, the difference between the pressure detection signal output from the first sensing signal measurement terminal of the Wheatstone bridge and the pressure detection signal output from the second sensing signal measurement terminal of the Wheatstone bridge is large, so that the sensitivity in sensing the touch pressure of the semiconductor pressure sensor 30 is improved and the pressure detection accuracy is ensured.

Moreover, a quadrilateral semiconductor pressure sensor 30 has two diagonal lines, and anyone of the two diagonal lines can be set to be perpendicular to the data lines 50, which is not limited herein.

Figure 9:
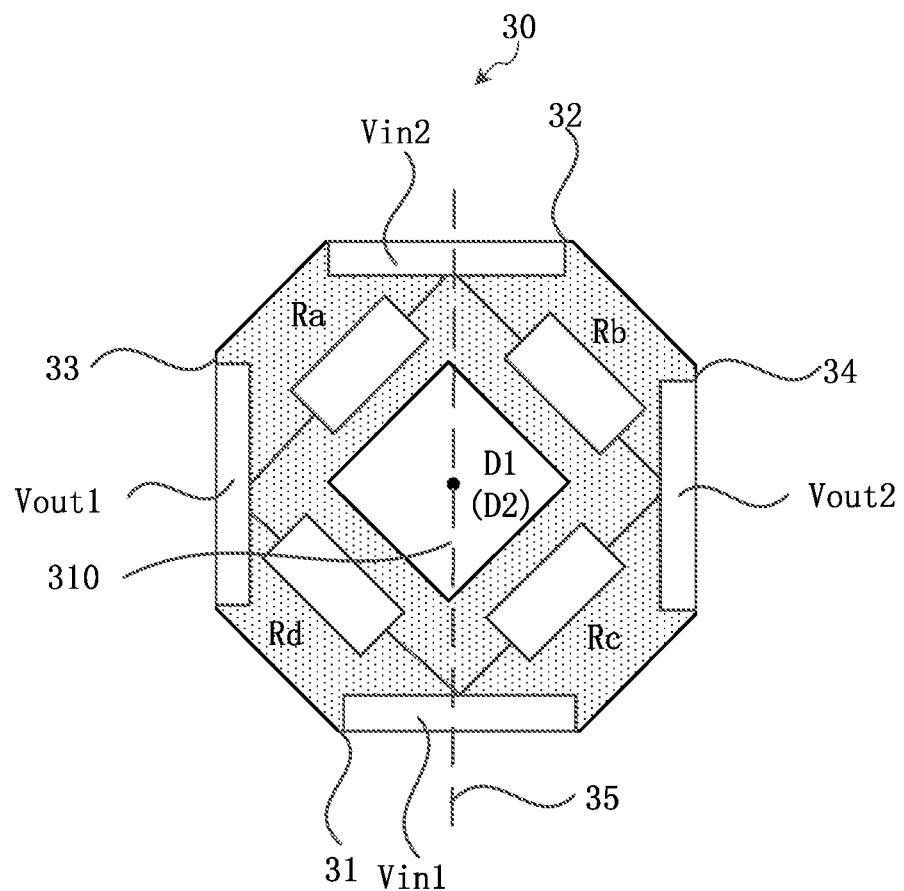
FIG. 9 is a schematic diagram illustrating another semiconductor pressure sensor provided by an embodiment of the present disclosure.

FIG. 9 is a schematic diagram illustrating another semiconductor pressure sensor provided by an embodiment of the present disclosure. Referring to FIG. 9, the outline of the semiconductor pressure sensor 30 is an octagon, and the shape of the hollow-out zone 310 is a square. A diagonal line of the hollow-out zone 310 is perpendicular to one side of the outline of the semiconductor pressure sensor 30. The first side 31 and the second side 32 of the semiconductor pressure sensor 30 are arranged opposite to each other, and the third side 33 and the fourth side 34 are arranged opposite to each other. The first side 31 and the third side 33 are separated by one side, and the first side 31 and the fourth side 34 are separated by one side. Referring to FIG. 9, the areas corresponding to the four equivalent resistors are slender, and thus the resistances of the four equivalent resistors and the voltage division of the semiconductor pressure sensor 30 are increased. Therefore, a large bias voltage is ensured for the semiconductor pressure sensor 30, thereby improving the pressure detection accuracy. Moreover, the four slender equivalent resistors have high sensitivity in deformation measurement in the direction of length. Specifically, one side of the hollow-out zone 310 is set to be perpendicular to the data lines of the display panel, so as to improve the sensitivity in pressure measurement of the semiconductor pressure sensor 30.

Figure 10:
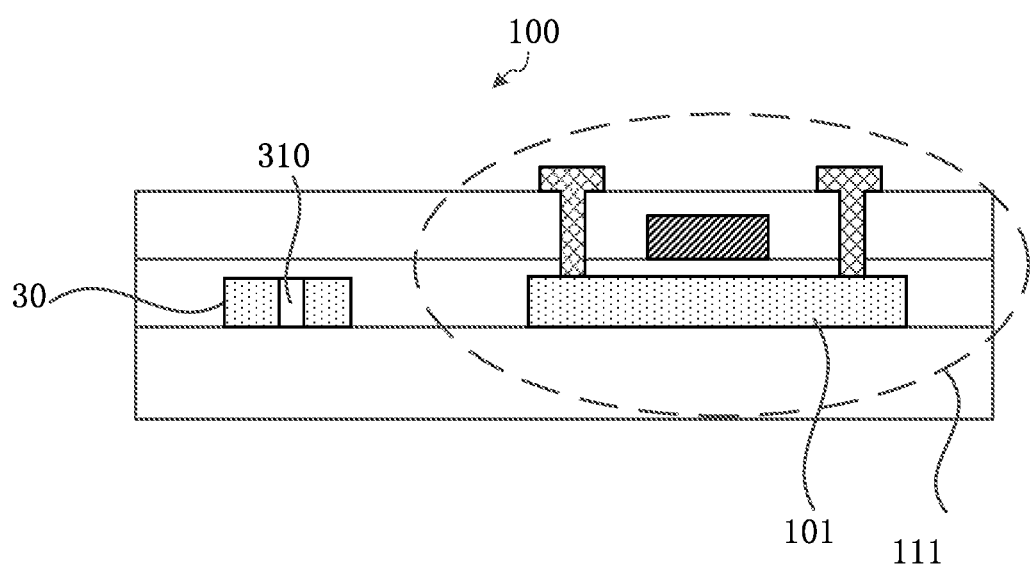
FIG. 10 is a cross sectional view of the display panel in FIG. 8 along section line A1-A2.

Optionally, FIG. 10 is a cross sectional view of the display panel in FIG. 8 along section line A1-A2. Referring to FIG. 8 and FIG. 10, the display panel includes an array substrate 100. The display area of the array substrate 100 is provided with a plurality of pixel units 110. Each of the plurality of pixel units 110 includes a thin film transistor 111. The semiconductor pressure sensor 30 and an active layer 101 of the thin film transistor 111 are arranged at the same layer.

Optionally, the semiconductor pressure sensor 30 is made of a polysilicon film.

Through such arrangement, the active layer 101 of the thin film transistor 111 and the semiconductor pressure sensor 30 can be made in a single manufacturing process, so that the step of manufacturing the polysilicon film is omitted. Therefore, the manufacturing process of the array substrate is simplified, and the production cost is reduced.

It should be pointed out that the areas corresponding to the display area in the array substrate and the areas corresponding to the display area in the display panel are same areas. In FIG. 8 and FIG. 10, exemplarily, merely the pixel units and the thin film transistors in the array substrate of the display panel are illustrated, and the other film layer structures are not shown, which is not a limitation to the present disclosure.

Figure 11A:
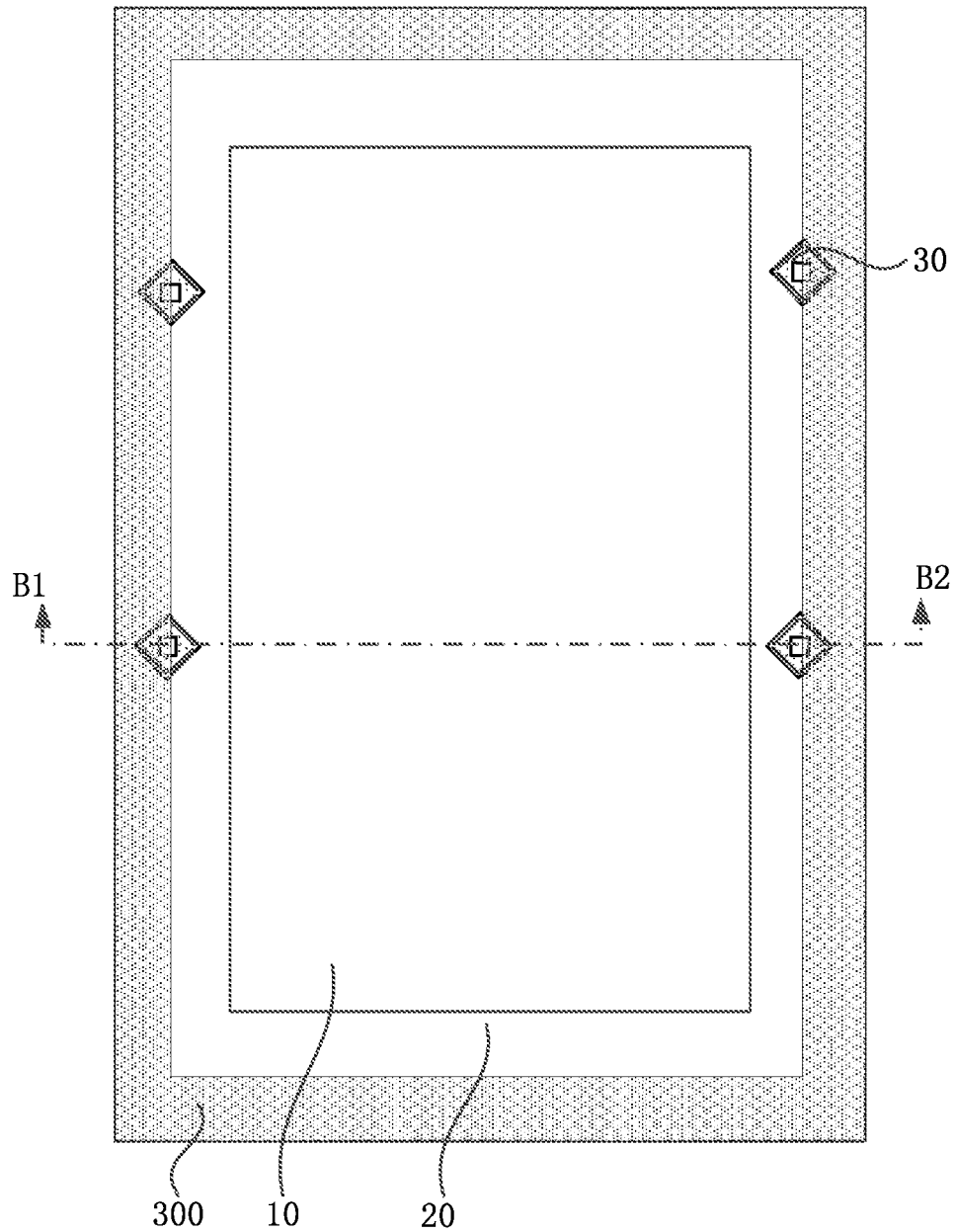
FIG. 11A is a schematic diagram illustrating another display panel provided by an embodiment of the present disclosure.
Figure 11B:
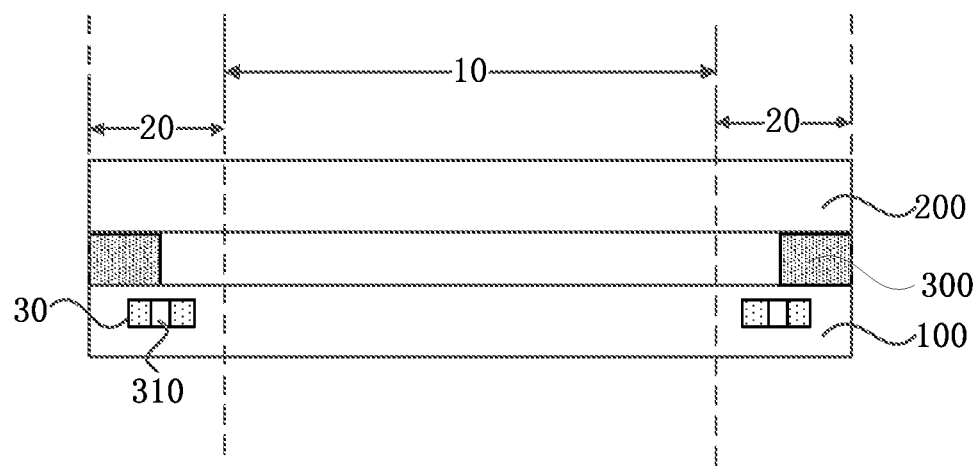
FIG. 11B is a cross sectional view of the display panel in FIG. 11A along section line B1-B2.

FIG. 11A is a schematic diagram illustrating another display panel provided by an embodiment of the present disclosure, and FIG. 11B is a cross sectional view of the display panel in FIG. 11A along section line B1-B2. Optionally, referring to FIG. 11A and FIG. 11B, the display panel further includes: a color filter 200, which is arranged opposite to the array substrate 100; a sealant 300, which is located at the non-display area 20 of the display panel and arranged between the color filter 200 and the array substrate 100. A perpendicular projection of the sealant 300 on the array substrate 100 partially overlaps with the hollow-out zone 310 of the semiconductor pressure sensor 30.

Specifically, when the sealant 300 is to be solidified, the sealant 300 is irradiated by a UV light from the side of the array substrate 100. In the embodiment of the present disclosure, the semiconductor pressure sensor 30 is provided with the hollow-out zone 310, and the perpendicular projection of the sealant 300 on the array substrate 100 partially overlaps with the hollow-out zone 310 of the semiconductor pressure sensor 30, so that the light blocked by the semiconductor pressure sensor 30 is reduced, thereby facilitating the solidifying of the sealant 300 and avoiding poor display caused by the leak and contamination of liquid crystals due to incomplete solidifying of the sealant 300.

Figure 12A:
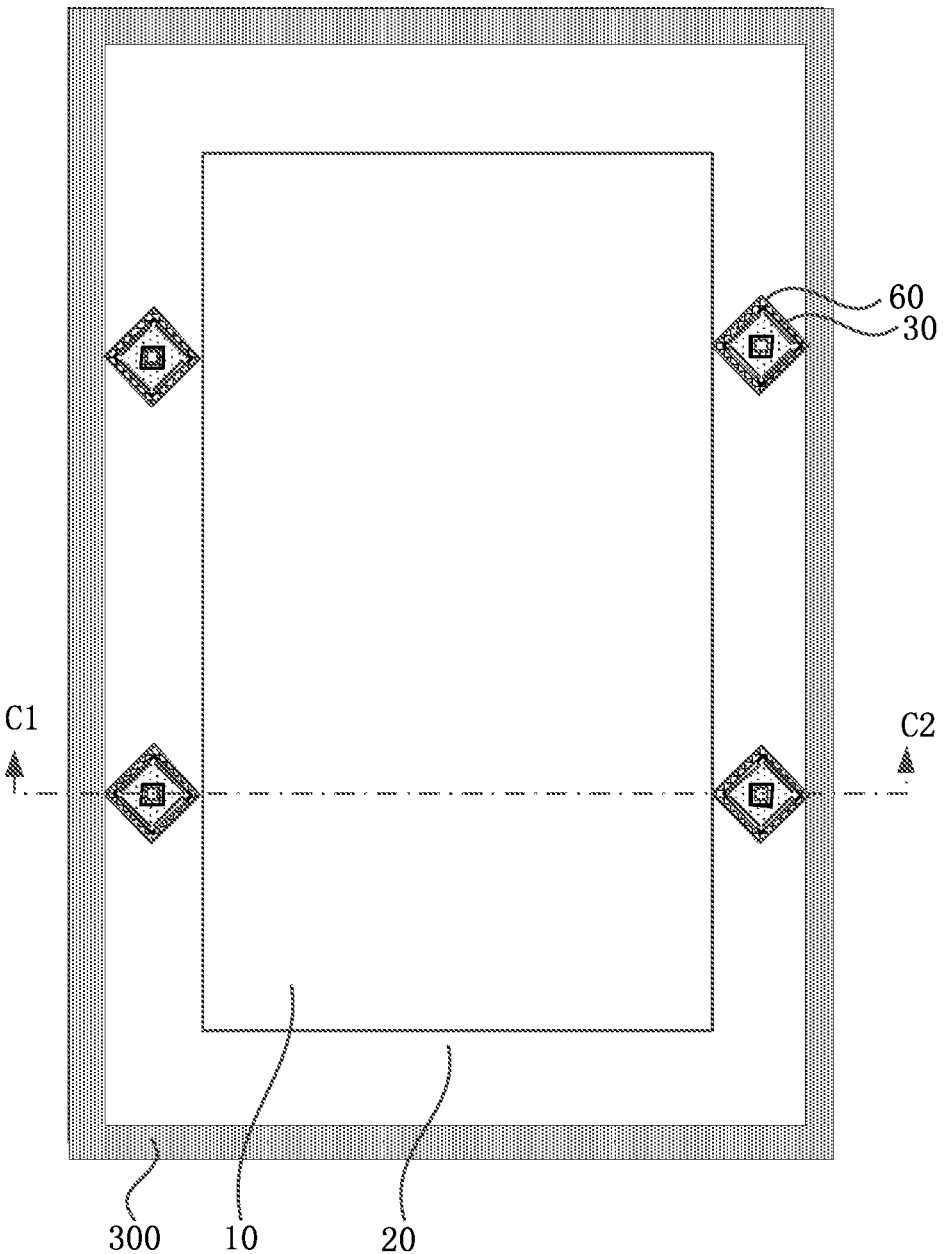
FIG. 12A is a schematic diagram illustrating another display panel provided by embodiments of the present disclosure.
Figure 12B:
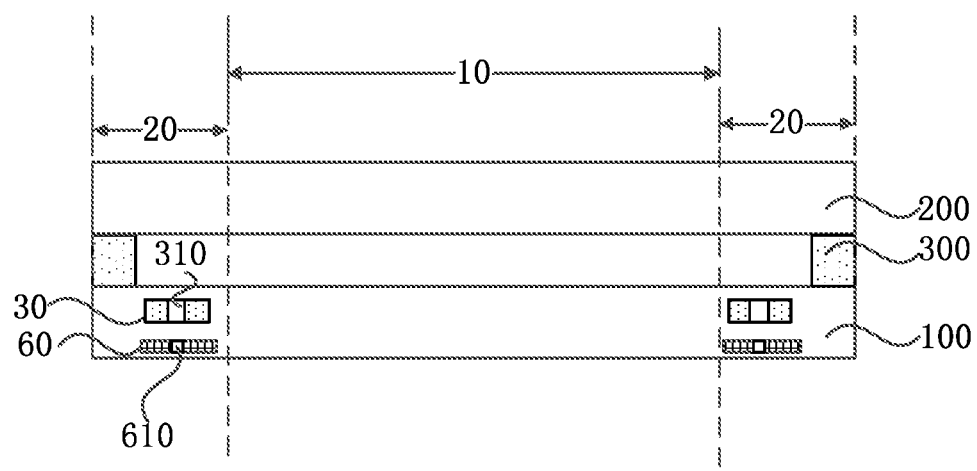
FIG. 12B is a cross sectional view of the display panel in FIG. 12A along section line C1-C2.

FIG. 12A is a schematic diagram illustrating another display panel provided by an embodiment of the present disclosure. FIG. 12B is a cross sectional view of the display panel in FIG. 12A along section line C1-C2. Optionally, referring to FIG. 12A and FIG. 12b, the display panel further includes: a color filter 200, which is arranged opposite to the array substrate 100; a sealant 300, which is located at the non-display area 20 of the display panel, and arranged between the color filter 200 and the array substrate 100. The perpendicular projection of the sealant 300 on the array substrate 100 does not overlap with the semiconductor pressure sensor 30.

Specifically, since the sealant 300 is used to achieve a function of fixation, the deformation of the sealant 300 is small when the display panel is pressed, which might affect the pressure detection performed by the semiconductor pressure sensor 30. By arranging the perpendicular projection of the sealant 300 on the array substrate 100 to be not overlapped with the semiconductor pressure sensor 30, the pressure detection accuracy of the semiconductor pressure sensor 30 is improved. Moreover, the light blocked by the semiconductor pressure sensor 30 is further reduced, which facilitates the solidifying of the sealant 300 and avoids the poor display caused by the leak and contamination of liquid crystals due to incomplete solidifying of the sealant 300.

Referring to FIG. 12A and FIG. 12B, the display panel further includes a shielding layer 60. The shielding layer 60 is arranged on the array substrate 100, and is located at a side facing away from the color filter 200 of the semiconductor pressure sensor 30. The perpendicular projection of the shielding layer 600 on the array substrate 100 covers the semiconductor pressure sensor 30. The shielding layer 60 includes an opening area 610. The perpendicular projection of the opening area 610 on the array substrate 100 is in the hollow-out zone 310.

Specifically, considering that the semiconductor pressure sensor 30 is near to the edge of the display area 10, the shielding layer 60 is provided so as to prevent the light emitted from a backlight of the display panel from diffracting or scattering to the semiconductor pressure sensor 30. The diffracting or scattering causes the semiconductor pressure sensor 30 to generate photon-generated carriers, which affects the resistance and the pressure detection performance of the semiconductor pressure sensor 30. Exemplarily, the shape of the shielding layer 60 is similar to that of the semiconductor pressure sensor 30, and the outline of the shielding layer 60 is larger than that of the semiconductor pressure sensor 30. The opening area 610 is slightly smaller than the hollow-out zone 310. Moreover, the material of the shielding layer 60 is Mo. If the thin film transistor in the array substrate 100 is provided with a shielding layer, the shielding layer 60 and the shielding layer of the thin film transistor may be fabricated at the same layer. Therefore, the processing steps are reduced, and the processing cost is reduced.

Figure 13:
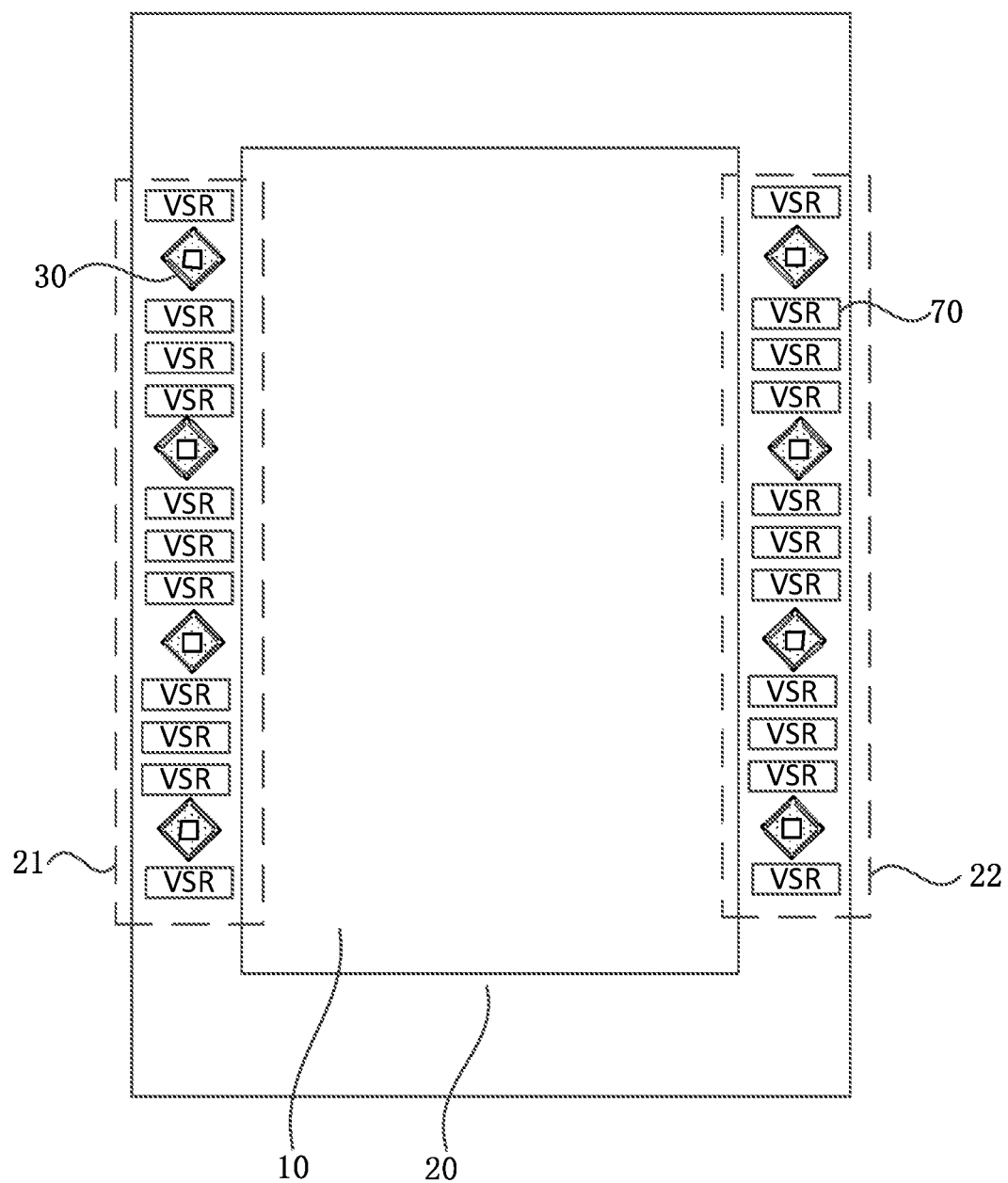
FIG. 13 is a schematic diagram illustrating another display panel provided by an embodiment of the present disclosure.

FIG. 13 is a schematic diagram illustrating another display panel provided by an embodiment of the present disclosure. Optionally, referring to FIG. 13, the non-display area 20 includes a first area 21 and a second area 22 which are opposite to each other. The first area 21 and the second area 22 extend along the long side of the display panel, and the semiconductor pressure sensors 30 are arranged in the first area 21 and/or the second area 22.

Specifically, the first area 21 and the second area 22 are located at the long side of the non-display area 20, and are disposed at two sides of the display area 10 respectively. With an increasing requirement for high resolution, a space where the semiconductor pressure sensors 30 can be arranged in the display area 10 becomes smaller. In addition, if the semiconductor pressure sensors 30 are arranged in the display area 10, the image display quality of the display panel may be affected. Therefore, arranging the semiconductor pressure sensors 30 in the first area 21 and/or the second area 22 meets the requirement for high resolution.

Optionally, referring to FIG. 13, the display panel further includes a plurality of shift registers. The plurality of shift registers are disposed in the first area 21 and the second area 22, and configured to provide scanning signals to the display panel. The semiconductor pressure sensor 30 is arranged between adjacent shift resistors 70. Through such arrangement, free areas between adjacent shift resistors 70 can be fully used, and thus it is not required for the semiconductor pressure sensor 30 to occupy too much area of the non-display area 20. As a result, it is benefit for narrowing the border of the display panel.

Figure 14:
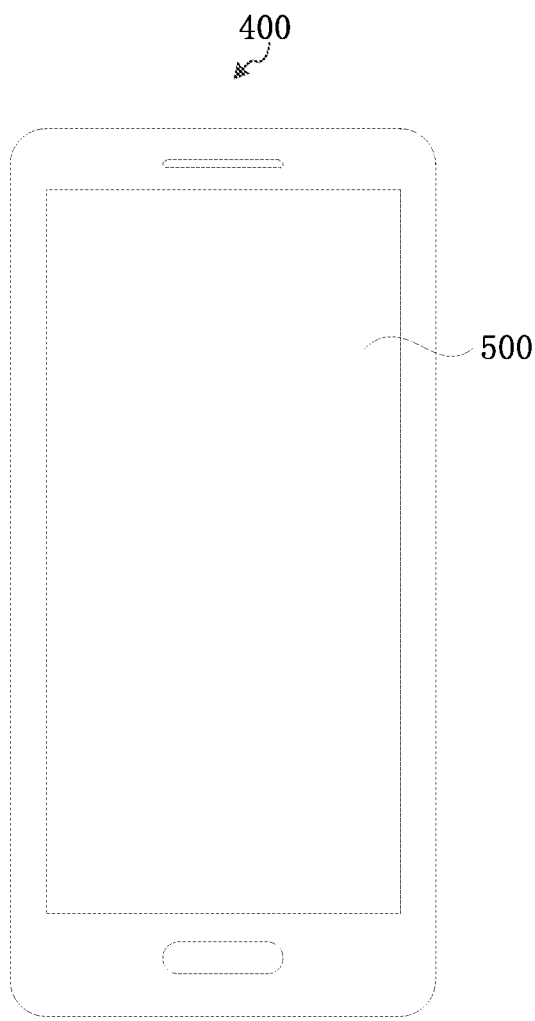
FIG. 14 is a schematic diagram illustrating a display apparatus provided by an embodiment of the disclosure.
Figure 15:
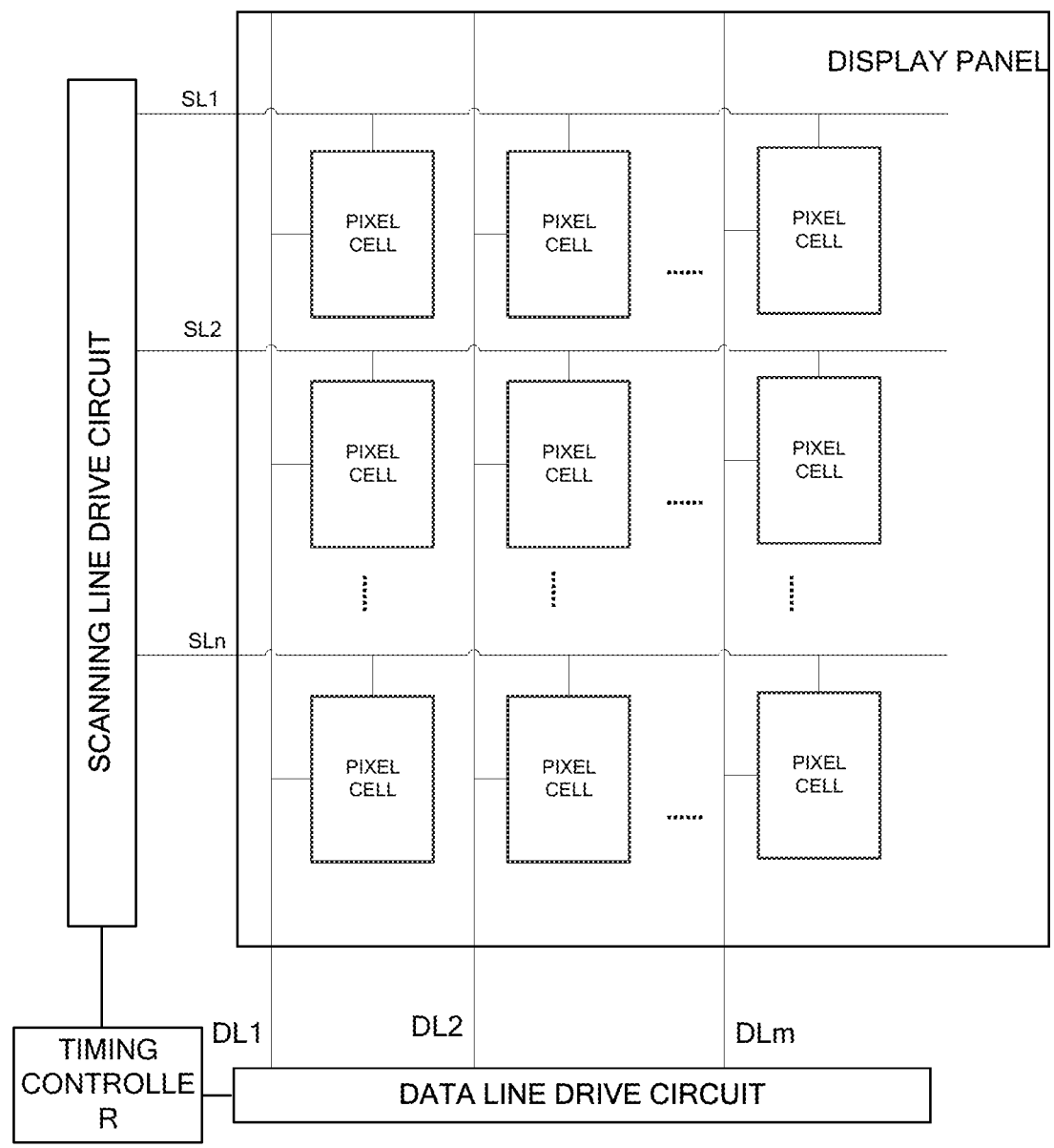
FIG. 15 is a schematic block diagram of a display apparatus according to a conventional display device.

The embodiments of the present disclosure further provide a display apparatus. FIG. 14 is a schematic diagram illustrating the display apparatus provided by the embodiment of the present disclosure. Referring to FIG. 14, the display apparatus 400 includes the display panel 500 provided by any embodiments of the present disclosure.

It should be noted that the above contents are only preferred embodiments of the present disclosure and used technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:
1. A display panel, comprising:
   an array substrate;
   a color filter, configured to be opposite to the array substrate;
   a display area and a non-display area surrounding the display area disposed on the array substrate;
   at least one semiconductor pressure sensor disposed in the non-display area, wherein the at least one semiconductor pressure sensor has a planar structure, and is provided with a hollow-out zone;
   wherein the array substrate is provided with a plurality of pixel units in the display area, wherein the plurality of pixel units each comprises a thin film transistor;
   wherein the semiconductor pressure sensor and an active layer of the thin film transistor are arranged in a same layer;
   wherein the display panel further comprises: a sealant, arranged between the color filter and the array substrate and in the non-display area of the display panel; and
   wherein a perpendicular projection of the sealant on the array substrate partially overlaps with the hollow-out zone of the at least one semiconductor pressure sensor.
2. The display panel according to claim 1, wherein a geometric center of the hollow-out zone coincides with a geometric center of an outline of the semiconductor pressure sensor.
3. The display panel according to claim 1, wherein
   an outline of the at least one semiconductor pressure sensor is a polygon, the polygon has at least four sides including a first side, a second side, a third side and a fourth side, wherein the first side and the second side are separated by at least one side of the polygon, and the third side and the fourth side are separated by at least one side of the polygon;
   wherein the at least one semiconductor pressure sensor comprises a first power signal input terminal located at the first side and a second power signal input terminal located at the second side, wherein the first power signal input terminal and the second power signal input terminal are configured to provide a bias voltage signal to the semiconductor pressure sensor;
   wherein the at least one semiconductor pressure sensor further comprises a first sensing signal measurement terminal located at the third side and a second sensing signal measurement terminal located at the fourth side, wherein the first sensing signal measurement terminal and the second sensing signal measurement terminal are configured to output a pressure detection signal from the semiconductor pressure sensor.

4. A display panel, comprising:
a display area and a non-display area surrounding the display area;
at least one semiconductor pressure sensor disposed in the non-display area, wherein the at least one semiconductor pressure sensor has a planar structure, and is provided with a hollow-out zone;
wherein the display area is provided with a plurality of pixel units, wherein the plurality of pixel units each comprises a thin film transistor;
wherein the semiconductor pressure sensor and an active layer of the thin film transistor are arranged in a same layer;
wherein the display panel further comprises:
a color filter, configured to be opposite to the array substrate; and
a sealant, wherein the sealant is located in the non-display area of the display panel, between the color filter and the array substrate; and
wherein a perpendicular projection of the sealant on the array substrate does not overlap with the at least one semiconductor pressure sensor.

5. The display panel according to claim 1, further comprising:
a light shielding layer, wherein the light shielding layer is disposed on the array substrate, and located at a side facing away from the color filter of the at least one semiconductor pressure sensor;
wherein a perpendicular projection of the light shielding layer on the array substrate covers the at least one semiconductor pressure sensor;
wherein the light shielding layer is provided with an opening area; and
wherein a perpendicular projection of the opening area on the array substrate is in the hollow-out area.

6. The display panel according to claim 4, further comprising:
a light shielding layer, wherein the light shielding layer is disposed on the array substrate, and located at a side facing away from the color filter of the at least one semiconductor pressure sensor;
wherein a perpendicular projection of the light shielding layer on the array substrate covers the at least one semiconductor pressure sensor; and
wherein the light shielding layer is provided with an opening area, wherein a perpendicular projection of the opening area on the array substrate is in the hollow-out area.

7. The display panel according to claim 1, wherein the at least one semiconductor pressure sensor is made of polysilicon films.

8. The display panel according to claim 1, wherein the at least one semiconductor pressure sensor is arranged along a long side of the display panel in the non-display area.

9. The display panel according to claim 8, further comprising:
a plurality of shift registers, configured to provide scanning signals to the display pane, wherein the at least one semiconductor pressure sensor is disposed between two adjacent shift registers.

10. The display panel according to claim 1, further comprising:
a drive circuit, configured to provide a bias voltage to the at least one semiconductor pressure sensor;
wherein the first power signal input terminal of the at least one semiconductor pressure sensor located at a same side of the display area is connected with a first signal output terminal of the drive circuit, and the second power signal input terminal of the at least one semiconductor pressure sensor located at the same side of the display area is connected with a second signal output terminal of the drive circuit.

11. A display device having a display panel according to claim 1.

12. The display panel according to claim 4, wherein a geometric center of the hollow-out zone coincides with a geometric center of an outline of the semiconductor pressure sensor.

13. The display panel according to claim 4, wherein:
an outline of the at least one semiconductor pressure sensor is a polygon, the polygon has at least four sides including a first side, a second side, a third side and a fourth side, wherein the first side and the second side are separated by at least one side of the polygon, and the third side and the fourth side are separated by at least one side of the polygon;
wherein the at least one semiconductor pressure sensor comprises a first power signal input terminal located at the first side and a second power signal input terminal located at the second side, wherein the first power signal input terminal and the second power signal input terminal are configured to provide a bias voltage signal to the semiconductor pressure sensor; wherein the at least one semiconductor pressure sensor further comprises a first sensing signal measurement terminal located at the third side and a second sensing signal measurement terminal located at the fourth side, wherein the first sensing signal measurement terminal and the second sensing signal measurement terminal are configured to output a pressure detection signal from the semiconductor pressure sensor.

14. The display panel according to claim 4, wherein the at least one semiconductor pressure sensor is made in polysilicon films.

15. The display panel according to claim 4, wherein the at least one semiconductor pressure sensor is arranged along a long side of the display panel in the non-display area.

16. The display panel according to claim 15, further comprising:
a plurality of shift registers, configured to provide scanning signals to the display panel, wherein the at least one semiconductor pressure sensor is disposed between two of the plurality of adjacent shift registers.

17. The display panel according to claim 4, further comprising: a drive circuit, configured to provide a bias voltage to the at least one semiconductor pressure sensor;
wherein the first power signal input terminal of the at least one semiconductor pressure sensor located at a same side of the display area is connected with a first signal output terminal of the drive circuit, and the second power signal input terminal of the at least one semiconductor pressure sensor located at the same side of the display area is connected with a second signal output terminal of the drive circuit.

18. A display device having a display panel according to claim 4.

* * * * *